(12) United States Patent
Castex et al.

(10) Patent No.: US 8,163,570 B2
(45) Date of Patent: Apr. 24, 2012

(54) METHOD OF INITIATING MOLECULAR BONDING

(75) Inventors: Arnaud Castex, Grenoble (FR); Marcel Broekaart, Theys (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 12/936,639

(22) PCT Filed: Aug. 6, 2009

(86) PCT No.: PCT/EP2009/060250
§ 371 (c)(1),
(2), (4) Date: Nov. 15, 2010

(87) PCT Pub. No.: WO2010/023082
PCT Pub. Date: Mar. 4, 2010

(65) Prior Publication Data
US 2011/0045611 A1 Feb. 24, 2011

(30) Foreign Application Priority Data
Aug. 28, 2008 (FR) ...................................... 08 55767

(51) Int. Cl.
*H01L 21/00* (2006.01)
*H01L 21/30* (2006.01)
(52) U.S. Cl. ............ 438/5; 438/455; 438/457; 438/459; 257/E21.53
(58) Field of Classification Search .............. 438/5, 455, 438/457, 459; 257/E21.53
See application file for complete search history.

(56) References Cited

U.S. PATENT DOCUMENTS

| | | | |
|---|---|---|---|
| 6,335,263 B1* | 1/2002 | Cheung et al. | 438/455 |
| 6,969,667 B2* | 11/2005 | Liebeskind et al. | 438/455 |
| 2002/0069964 A1* | 6/2002 | Noda et al. | 156/325 |
| 2002/0127821 A1 | 9/2002 | Ohya et al. | |
| 2003/0183307 A1* | 10/2003 | Liebeskind et al. | 148/415 |
| 2004/0262772 A1* | 12/2004 | Ramanathan et al. | 257/777 |
| 2005/0260828 A1* | 11/2005 | Yuasa | 438/455 |
| 2006/0030074 A1* | 2/2006 | Mund et al. | 438/108 |
| 2007/0004172 A1* | 1/2007 | Yang | 438/458 |
| 2007/0090299 A1* | 4/2007 | Kozakai et al. | 250/370.01 |
| 2007/0148480 A1* | 6/2007 | Ishiwata et al. | 428/473.5 |
| 2007/0207566 A1 | 9/2007 | Fu et al. | |
| 2008/0296584 A1* | 12/2008 | Hachigo | 257/76 |
| 2009/0081432 A1* | 3/2009 | Gomi | 428/214 |

FOREIGN PATENT DOCUMENTS

| | | |
|---|---|---|
| EP | 0410679 A | 1/1991 |
| EP | 1698460 A | 9/2006 |
| EP | 1777278 A | 4/2007 |

(Continued)

OTHER PUBLICATIONS

International Search Report for International Application No. PCT/EP2009/060250 mailed Oct. 9, 2009, 3 pages.

(Continued)

*Primary Examiner* — Kevin Parendo
(74) *Attorney, Agent, or Firm* — TraskBritt

(57) ABSTRACT

A method of initiating molecular bonding, comprising bringing one face of a first wafer to face one face of a second wafer and initiating a point of contact between the two facing faces. The point of contact is initiated by application to one of the two wafers, for example, using a bearing element of a tool, of a mechanical pressure in the range from 0.1 MPa to 33.3 MPa.

20 Claims, 4 Drawing Sheets

FOREIGN PATENT DOCUMENTS

| | | |
|---|---|---|
| FR | 2866982 A | 9/2005 |
| WO | 02071475 A | 9/2002 |
| WO | 03081664 A | 10/2003 |
| WO | 2006078631 A2 | 7/2006 |
| WO | 2010023082 A1 | 3/2010 |

OTHER PUBLICATIONS

Horie et al: "Advanced Soi Devices Using CMP and Wafer Bonding": Extended Abstracts of the Intn. Conf. on Solid State Devices and Materials; Japan Society of Applied Physics; Tokyo JP vol. Con. 1996; pp. 473-475.

Kim-Lee et al., "Capillary assisted alignment for high density wafer-level integration," in Proceedings of Conference on Wafer Bonding for MEMS Technologies and Wafer-Level Integration, Slides 1-26 (2007).

Steen et al, Overlay as the Key to Drive Wafer Scale 3D Integration, Microelectronic Engineering, vol. 84 (2007) pp. 1412-1415.

Turner et al., "Mechanics of wafer bonding: Effect of clamping," Journal of Applied Physics, vol. 95, 349-55 (2004).

Turner et al., "Modeling of direct wafer bonding: Effect of wafer bow and etch patterns," Journal of Applied Physics, 92, 7658-66 (2002).

Turner et al., "Predicting distortions and overlay errors due to wafer deformation during chucking on lithography scanners," Journal of Micro/Nanolithography, MEMS, and MOEMS, 8, 043015 (2009) 8 pages.

International Search Report for International Application No. PCT/EP2010/052765 mailed Apr. 26, 2010, 3 pages.

Written Opinion for Singapore Application No. 2010068693-3 dated Oct. 25, 2011, 6 pages.

* cited by examiner

METHOD OF INITIATING MOLECULAR BONDING

CROSS-REFERENCE TO RELATED APPLICATIONS

This application is a national phase entry under 35 U.S.C. §371 of International Patent Application PCT/EP2009/060250, filed Aug. 6, 2009, published in English as International Patent Publication WO 2010/023082 A1 on Mar. 4, 2010, which claims the benefit under Article 8 of the Patent Cooperation Treaty to European Patent Application Serial No. 08 55767, filed Aug. 28, 2008, the entire disclosure of each of which is hereby incorporated herein by this reference.

TECHNICAL FIELD

The present invention relates to the field of producing multilayer semiconductor wafers or substrates produced by transferring at least one layer formed from an initial substrate onto a final substrate, the transferred layer corresponding to a portion of the initial substrate. The transferred layer may further comprise all or part of a component or a plurality of microcomponents.

BACKGROUND

More precisely, the present invention relates to the problem of heterogeneous deformations that appear during transfer of a layer from a substrate termed the "donor substrate" onto a final substrate termed the "receiving substrate." Such deformations have been observed in particular with the three-dimensional component integration technique (3-D integration) that requires transfer of one or more layers of microcomponents onto a final support substrate, and also with the transfer of circuits or with the fabrication of back-lit imagers. The transferred layer or layers include microcomponents (electronic, optoelectronic, etc.) produced at least partially on an initial substrate, said layers then being stacked on a final substrate that may optionally itself include components. Primarily because of the very small size and the large number of microcomponents present on a single layer, each transferred layer must be positioned on the final substrate with high precision in order to come into very strict alignment with the subjacent layer. Further, it may be necessary to carry out treatments on the layer after it has been transferred, for example to form other microcomponents, to uncover the surface of the microcomponents, to produce interconnections, etc.

However, the applicant has observed that after transfer, there are circumstances when it is very difficult, if not impossible, to form additional microcomponents that are aligned with the microcomponents formed before transfer.

This misalignment phenomenon is described with reference to FIGS. 1A to 1E that illustrate an exemplary embodiment of a three-dimensional structure comprising transfer, onto a final substrate, of a layer of microcomponents formed on an initial substrate, and formation of an additional layer of microcomponents on the exposed face of the initial substrate after bonding. FIGS. 1A and 1B illustrate an initial substrate 10 on which a first series of microcomponents 11 is formed. The microcomponents 11 are formed by photolithography using a mask that can define pattern formation zones corresponding to the microcomponents 11 to be produced.

As can be seen in FIG. 1C, the face of the initial substrate 10 comprising the microcomponents 11 is then brought into intimate contact with one face of a final substrate 20. Bonding between the initial substrate 10 and the final substrate 20 is generally carried out by molecular bonding. Thus, a buried layer of microcomponents 11 is formed at the bonding interface between substrates 10 and 20. After bonding and as can be seen in FIG. 1D, the initial substrate 10 is thinned in order to remove a portion of the material present above the layer of microcomponents 11. A composite structure 30 is thus formed from the final substrate 20 and a layer 10a corresponding to the remaining portion of the initial substrate 10.

As can be seen in FIG. 1E, the next step in producing the three-dimensional structure consists of forming a second layer of microcomponents $12_1$-$12_9$ at the exposed surface of the thinned initial substrate 10 or of carrying out additional technical steps on that exposed surface in alignment with the components included in the layer 10a (contact points, interconnections, etc.). For the purposes of simplification, the term "microcomponents" is used in the remainder of this text to define devices or any other patterns resulting from technical steps carried out on or in the layers that must be positioned with precision. Thus, they may be active or passive components, a mere contact point, or interconnections.

In order to form the microcomponents $12_1$-$12_9$ in alignment with the buried microcomponents 11, a photolithography mask is used that is similar to that used to form the microcomponents 11. The transferred layers, like the layer 10a, typically include marks both at the microcomponents and at the section forming the layer that are in particular used by the positioning and alignment tools during the technical treatment steps, such as those carried out during photolithography.

However, even using positioning tools, offsets occur between some of the microcomponents $11_1$-$11_9$ and $12_1$-$12_9$, such as the offsets $\Delta_{11}$, $\Delta_{22}$, $\Delta_{33}$, $\Delta_{44}$ indicated in FIG. 1E (respectively corresponding to the offsets observed between the pairs of microcomponents $11_1/12_1$, $11_2/12_2$, $11_3/12_3$ and $11_4/12_4$).

Such offsets are not the result of elementary transformations (translation, rotation or combinations thereof) that could originate in inaccurate assembly of the substrates. These offsets result from non-homogeneous deformations that appear in the layer derived from the initial substrate while it is being assembled with the final substrate. In fact, such deformations involve local and non-uniform displacements of certain microcomponents 11. In addition, certain of the microcomponents $12_1$-$12_9$ formed on the exposed surface of the substrate after transfer exhibit positional variations with those microcomponents 11 that may be of the order of several hundred nanometers, or even of micrometer order.

This phenomenon of misalignment (also termed "overlay") between the two layers of microcomponents 11 and $12_1$-$12_9$ may be a source of short circuits, distortions in the stack, or connection defects between the microcomponents of the two layers. Thus, when the transferred microcomponents are imagers made up of pixels, and the post-transfer treatment steps are aimed at forming color filters on each of those pixels, a loss of the colorizing function is observed for certain of those pixels.

The overlay phenomenon thus results in a reduction in the quality and the value of the fabricated multilayer semiconductor wafers. The impact of the phenomenon is increasing because of the ever-increasing demand for miniaturization of microcomponents and their increased integration density per layer.

Problems with alignment during fabrication of three-dimensional structures are well known. The document by Burns et al., "A Wafer-Scale 3-D Circuit Integration Technology," IEEE Transactions on Electronic Devices, vol. 53, No. 10, Oct. 2006, describes a method of detecting variations in alignment between bonded substrates. The document by Haisma et al., "Silicon-Wafer Fabrication and (Potential) Applications of Direct-Bonded Silicon," *Philips Journal of Research*, vol. 49, Nos. 1 and 2, 1995, emphasizes the importance of wafer flatness, in particular during polishing steps, in order to obtain good quality final wafers, i.e., with as few offsets as possible between the microcomponents. However, those documents are concerned only with the problem of positioning the wafers while they are being assembled. As explained above, the applicant has observed that even when the two wafers are perfectly mutually aligned when put into contact (using marks provided for that purpose), non-homogeneous displacements of certain microcomponents occur following initiation of the bonding wave.

BRIEF SUMMARY

The invention aims to provide a solution that can limit non-homogenous deformations which appear in a substrate during transfer thereof onto another substrate.

To this end, the present invention proposes a method of initiating molecular bonding, comprising bringing one face of a first wafer or substrate to face one face of a second wafer or substrate and initiating a point of contact between the two facing faces, the method being characterized in that the point of contact is initiated by applying mechanical pressure to one of the two wafers, said pressure being in the range from 0.1 MPa (megapascal) to 33.3 MPa.

Thus, by limiting the pressure applied to one of the two substrates during initiation of a point of contact, the non-homogeneous deformations caused in the wafer are reduced, while carrying out bonding by molecular bonding over the whole surface of the two wafers in contact.

By minimizing thereby the deformations normally caused by application of a point of contact to produce bonding by molecular bonding, the risks of overlay during subsequent formation of the additional layers of microcomponents are substantially reduced.

In accordance with a first aspect of the invention, the mechanical pressure is applied over a surface area of 1 mm$^2$ (square millimeter) or less.

In accordance with a particular aspect of the invention, initiation of the point of contact is achieved by applying a tool to one of the two substrates, the tool having a contact surface area on the substrate in the range from 0.3 mm$^2$ to 1 mm$^2$ and in that the bearing force exerted by the tool on the substrate is in the range from 0.1 N (newton) to 10 N.

The present invention also provides a method of producing a composite three-dimensional structure, comprising a step of producing a first layer of microcomponents on one face of a first wafer or substrate and a step of bonding the face of the first wafer comprising the layer of microcomponents onto a second wafer or substrate, the method being characterized in that during the bonding step, molecular bonding is initiated in accordance with the molecular bonding initiation method of the invention.

The use of a molecular bonding initiation method of the present invention can, during transfer of a layer of microcomponents, eliminate or limit the phenomenon of overlay and produce very high quality multilayer semiconductor wafers. The layer of microcomponents may in particular include image sensors.

DETAILED DESCRIPTION

Figure 1A:
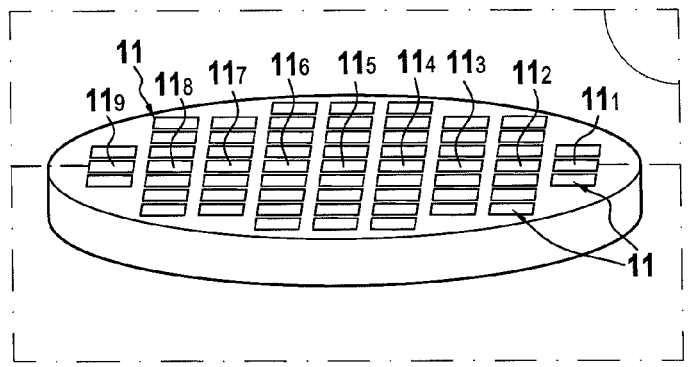
FIGS. 1A to 1E are diagrammatic views showing production of a prior art three-dimensional structure.
Figure 1B:
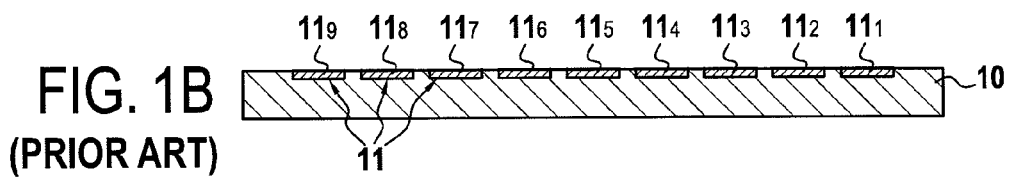
Figure 1C:
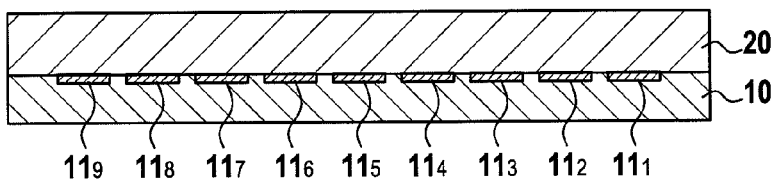
Figure 1D:
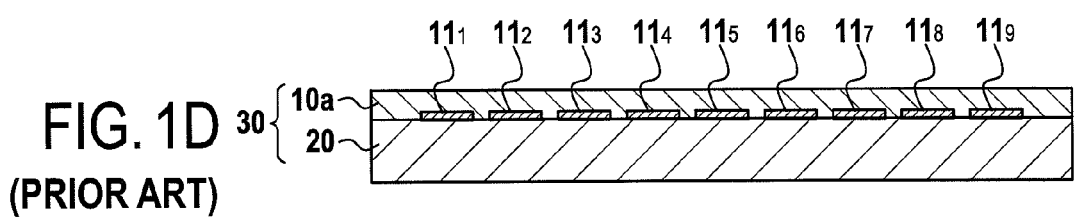
Figure 1E:
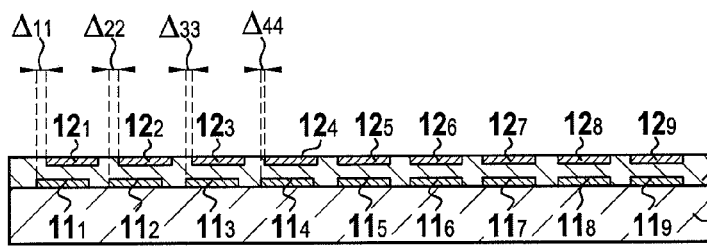

The present invention is generally applicable to the production of composite structures including at least the bonding of a first substrate or wafer onto a second substrate or wafer by molecular bonding.

Bonding by molecular bonding is a technique that is well known per se. It should be recalled that the principle of bonding by molecular bonding is based on bringing two surfaces into direct contact, i.e., without the use of a specific material (adhesive, wax, brazing material, etc.). Such an operation requires the surfaces for bonding to be sufficiently smooth, to be free of particles or of contamination, and to be sufficiently close together for contact to be initiated, typically a distance of less than a few nanometers. The attractive forces between the two surfaces are then sufficiently high to cause molecular bonding (bonding induced by the set of attractive forces (van der Waals forces)) of electronic interaction between atoms or molecules of the two surfaces to be bonded.

Molecular bonding is carried out by initiating a point of contact on one wafer in intimate contact with another wafer in order to trigger the propagation of a bonding wave from that point of contact. The term "bonding wave" used here is the bonding or molecular bonding front that propagates from the initiation point and that corresponds to diffusion of the attractive forces (van der Waals forces) from the point of contact over the whole surface area between the two wafers in intimate contact (bonding interface). The point of contact is initiated by applying mechanical pressure to one of the two wafers.

The applicant has demonstrated that the relative displacements between certain patterns or microcomponents in one and the same wafer appear as a result of the step of molecular bonding of that wafer onto another. More precisely, experiments carried out by the applicant have demonstrated that stresses (tensile and/or compressive) are produced at the point of contact, i.e., the region where the mechanical pressure is applied. These stresses are the source of the non-homogeneous deformations appearing in the wafer and as a result of the relative and unequal displacements of certain patterns or microcomponents relative to each other.

The applicant has observed that the deformations are principally localized at and around the point of contact and that these deformations are elastic. These deformations may extend over a radius of up to 15 cm about the point of pressure application.

As a result, the present invention proposes controlling the mechanical pressure applied at the contact point in order to limit the stresses in this zone while allowing initiation and propagation of a bonding wave between the two wafers in contact. In accordance with the invention, the pressure applied at the point of contact is in the range from 0.1 MPa to 33.3 MPa. The initiation point may be located anywhere on the wafer. It is preferably located close to the edge thereof. The surface area of the zone of application of this pressure is typically less than a few square millimeters, for example, 1 mm$^2$. Larger application surface areas are possible but run the risk that too large a contact surface area (more than 5 mm$^2$, for example) could result in aggravation of the deformation (overlay).

The application of such a mechanical pressure is sufficient to initiate a point of contact between two wafers and as a result to allow the propagation of a bonding wave over the whole contact surface between the wafers without causing stresses that are too high. Thus, by controlling the mechanical pressure applied to initiate the point of contact, the deformations arising in the wafer are reduced. Preferably, the pressure applied at the point of contact is less than 10 MPa; more preferably, this pressure is in the range from 0.1 MPa to 5 MPa.

The period during which the mechanical pressure is applied corresponds to at least the minimum period that can activate the phenomenon of propagation of the bonding wave. This minimum period substantially corresponds to the period necessary for the bonding wave to propagate over the contact surface between the wafers. The mechanical pressure application period is generally between 1 second and 10 seconds, typically 5 seconds, in order to assemble wafers with a 200 mm diameter.

Figure 2:
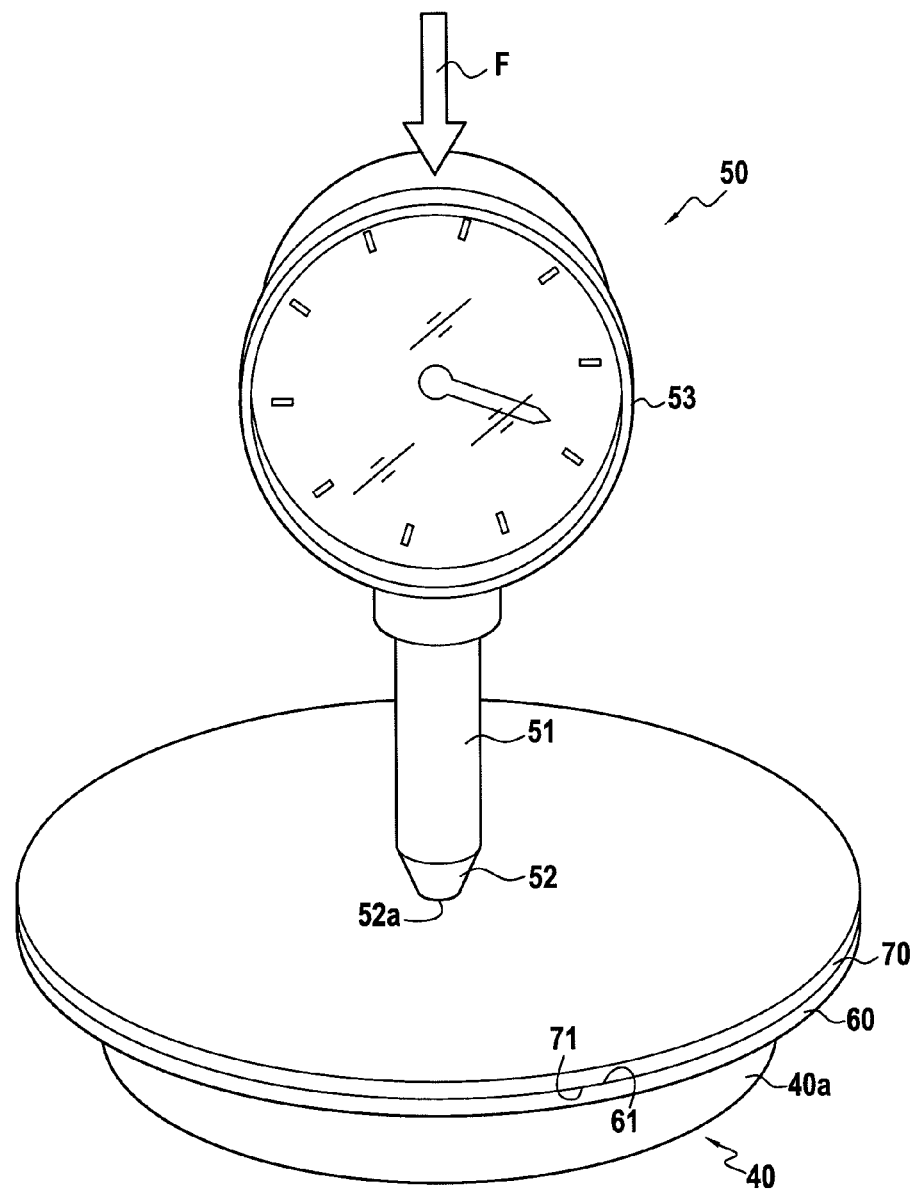
FIG. 2 is a diagrammatic view of a molecular bonding initiation method in accordance with one embodiment of the invention.

The controlled application of mechanical pressure may be carried out using a tool. In FIG. 2, a first wafer or substrate 60 is placed in a bonding machine comprising a substrate support device 40. The substrate support device 40 comprises a support platen 40a, the planarity defects of which are preferably less than 15 microns. The support platen 40a, holds the first wafer 60, for example, by means of an electrostatic or suction system associated with the support platen 40a or simply under gravity, with a view to assemble it by molecular bonding, with a second wafer or substrate 70. The associated systems for holding the wafer (electrostatic or by suction) are used provided that it has been ascertained that they do not deform the wafer so as not to accentuate problems with overlay.

As explained above and in known manner, the surfaces 61 and 71 respectively of wafers 60 and 70 that are to be bonded have been prepared (polished, cleaned, hydrophobic/hydrophilic treatment, etc.) in order to allow molecular bonding.

The surfaces 61, 71 of wafers 60, 70 are then brought into intimate contact with each other. Initiation of the point of contact for molecular bonding is carried out by means of a tool 50. As shown in a highly diagrammatic manner in FIG. 2, the tool 50 comprises a bearing element 51, such as a stylus, and a dynamometer 53. The bearing element 51 is connected to the dynamometer 53 and comprises a free end 52 via which a mechanical pressure is exerted on the wafer 70 in order to initiate a point of contact between the two wafers 60 and 70. The end 52 has a contact surface area 52a that is in the range from 0.3 mm$^2$ to 1 mm$^2$. Knowing the area of the contact surface 52a of the tool 50 with the wafer 70, it is possible to apply a mechanical pressure in the range from 0.1 MPa to 33.3 MPa by controlling the bearing force F exerted by the tool 50 on the wafer 70 (bearing force=mechanical pressure× bearing surface area). The bearing force exerted by the end 52 on the wafer 70 is controlled by the dynamometer 53. This force is in the range from 0.1 N to 10 N.

As an example, if a mechanical pressure of 3.5 MPa (pressure sufficient to initiate a point of contact and, as a result, a bonding wave between the two wafers 60 and 70) is to be applied with a tool, the end of which tool has a contact surface area of 1 mm$^2$, a bearing force of 3.5 N is applied, for instance, for about 6 seconds.

The bearing element 51, as shown in FIG. 2, and more particularly its end 52 intended to come into contact with the wafer 70 may be produced from or covered with a material such as TEFLON®, silicone or a polymer. In general, the end of the bearing element 51 is produced from or coated with a material that is sufficiently rigid to be able to apply the pressure in a controlled manner. Too flexible of a material would deform and result in an imprecise contact surface and, as a result, in a lack of precision in the applied pressure. In contrast, too rigid a material could result in the formation of defects (impressions) on the surface of the wafer 70.

The molecular bonding initiation method of the invention may be carried out automatically in a bonding machine. The bonding machine comprises a bearing element connected to an actuator (for example, a cylinder or a mechanical arm). In some embodiments, the bonding machine has the ability to position the bearing element at any location on a surface of a wafer, along a diameter, or a along a radius of a stack formed of bonded wafers. The bonding machine also comprises a force sensor (dynamometer, stress gage, etc.) and a servocontrol intended to drive the actuator. The servocontrol drives the actuator in a manner that controls the mechanical pressure applied by the bearing element. More precisely, the servocontrol receives data from the force sensor and compares them with a predetermined value for the bearing force that is a function of the mechanical pressure that should be applied and of the surface area of the end of the bearing element. The bonding machine may also comprise a measurement system to determine the wafer's deformation (such as bow and warp measurements). As it will be understood from the discussion below, low pressure to initiate the bonding wave (for instance, below 1 MPa), could be achieved if the initiation location is positioned at predetermined specific positions.

Preferably, the wafers have limited bow deformation. It may be difficult to initiate, in a repeatable manner, the development of the bonding wave with the limited pressure of the invention (in particular when the pressure is selected so as to be less than 10 MPa, or in the range from 0.1 MPa to 5 MPa). Tests carried out by applying a force of 3.7 N close to the edge of the wafer, by using a stylus with a contact surface having an area of approximately 1 mm$^2$ have shown that the acceptable deformation for wafers or substrates in order to ensure good bonding should be in the range from −10 μm to +10 μm for the final substrate or wafer (support substrate) with a 200 mm diameter and in the range from −45 μM to +45 μm for the initial substrate or wafer comprising components (the initial substrate or wafer having a wider range of tolerable deformation since deposition of the oxide, or anything of any other nature that is carried out on the components in order to facilitate the molecular bonding step introduces additional deformation). These measurements were carried out by means of a capacitative measurement using ADE type equipment from KLA-Tencor Corporation. These limiting deformation values to ensure good bonding correspond to a constant bow to wafer diameter ratio. As a result, they are also valid for wafers with a larger diameter (for example, 300 mm), with the appropriate correction for taking into account the larger diameter value.

When one or both of the wafers carries a deformation, it may be advantageous to select the location at which the point of contact (place of application of the mechanical pressure) is initiated as a function of the shape of the wafers that are brought into contact, in order to further minimize the mechanical pressure necessary for molecular bonding. If the two wafers to be bonded are not perfectly planar, the local mutual separation of the surfaces of the facing wafers will not be constant. Thus, as shown in a highly diagrammatic manner in FIG. 5, a wafer 520, for example, a circuit wafer having a concave deformation, must be bonded by molecular bonding onto a planar wafer 510, such as a bulk wafer that may have been oxidized. The point of contact initiated by application of a mechanical pressure Pm is then preferably located at point A, namely at the center of the concave deformation, rather than at point B, since the mechanical pressure that has to be applied to initiate bonding would be higher in absolute terms at point B than at point A, and as a result would produce greater deformations. A test has been carried out with wafers of substrates similar to those illustrated in FIG. 5. In this test, a force of 0.3 N is applied during about 2 seconds at the center of the generally concave wafer or substrate 520 positioned in contact with the generally flat wafer or substrate 510. This generally flat wafer or substrate 510 is placed on a flat wafer/substrate support device of a bonding machine. In this particular configuration, the limited force is sufficient to initiate the bonding wave while minimizing the wafer's deformation.

The point of contact could also be selected such that it corresponds to a location where the wafer support device and the supported wafer are in close contact or at the shortest distance from one another, in particular, when the supported wafer presents at least a concave or a convex deformation.

These last two requirements ensure that the necessary pressure that is applied to initiate the bonding will lead to a minimal vertical displacement of the wafers and, thus, minimize wafer deformation.

Figure 6:
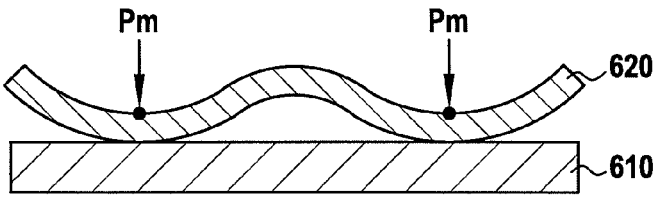

Similarly, as shown in FIG. 6, when a wafer 620, for example, a circuit wafer, has a more complex deformation, i.e., with several concave and convex portions relative to another flat wafer 610, then, preferably, the point of contact and thus application of the mechanical pressure Pm is initiated at a center of concave zones of the wafer 620. The center of the concave zones corresponds to the regions of the wafers 610, 620 where the distance between these regions and the flat wafer 610 is the smallest and, as a result, requires the application of a lower mechanical pressure than at other zones on the wafers. And preferably, the mechanical pressure is applied at a location where the substrate support device is in close proximity of the wafer 610 to avoid any vertical displacement of the bonded stack while the bonding wave is being displaced.

Figure 7:
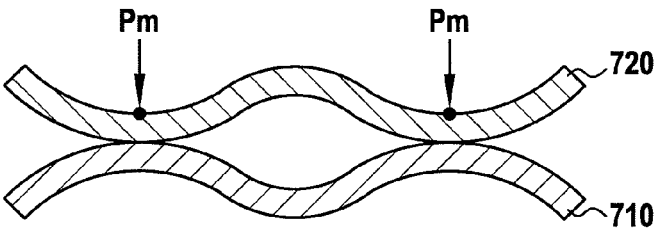

In FIG. 7, two wafers 710 and 720, respectively, to be assembled, each have their own deformation. The choice of the point of application of mechanical pressure Pm to initiate the point of contact between the two wafers 710, 720 is determined as a function of the position of the two wafers when they are placed facing each other.

Information of the wafers' shapes collected from the wafer deformation measurement system could be used to determine the most appropriate location.

Figure 5:
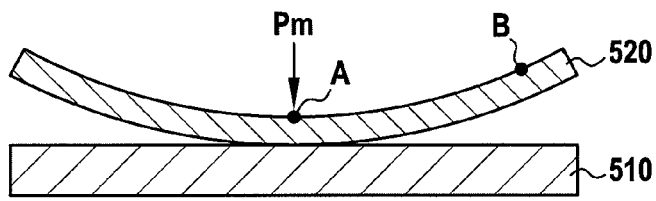
FIGS. 5 to 7 show, highly diagrammatical implementations of the molecular bonding initiation method of the invention.

In a variation, for example, where a tool (stylus) used to initiate the point of contact cannot be displaced relative to the wafers, a predetermined deformation may be imposed on one or both wafers so that the zone of the wafer present beneath the tool corresponds to the point requiring the least mechanical pressure. Under such circumstances, with a bonding machine in which the tool is in a fixed position above the center of the wafers, it may, for example, be possible to impose on the upper wafer a deformation similar to that as depicted in FIG. 5.

The process of the invention is applicable to assembling any type of material that is compatible with molecular bonding, in particular, semiconductor materials such as silicon, germanium, glass, quartz, sapphire, etc. The wafers to be assembled may, in particular, have a diameter of 100 mm, 150 mm, 200 mm or 300 mm. The wafers also may include microcomponents on the majority of their surface or only in a limited zone.

One particular, but non-exclusive, field for the assembly method of the present invention is that of producing three-dimensional structures.

One method of producing a three-dimensional structure by transfer of a layer of microcomponents formed on an initial substrate onto a final substrate in accordance with an embodiment of the invention is described with reference to FIGS. 3A to 3D and FIG. 4.

Figure 3A:
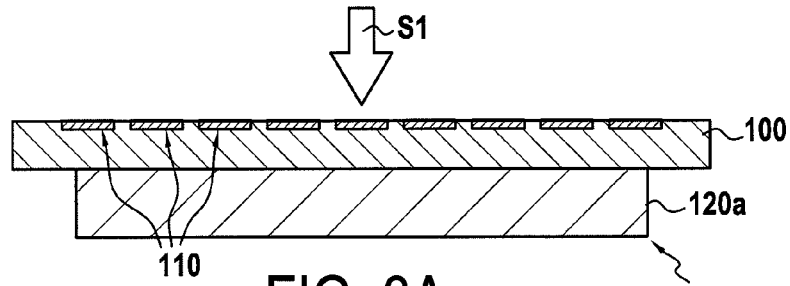
FIGS. 3A to 3D are diagrammatic views showing the production of a three-dimensional structure using the molecular bonding initiation method of the present invention.

Production of the three-dimensional structure commences by forming a first series of microcomponents 110 on the surface of a wafer or initial substrate 100 (FIG. 3A, step S1). The microcomponents 110 may be entire components and/or only a portion thereof. The initial substrate 100 may be a monolayer structure, for example, a layer of silicon, or a multilayer structure such as an SOI-type structure. The microcomponents 110 are formed by photolithography using a mask that can define pattern formation zones corresponding to the microcomponents 110 to be produced. During the formation of microcomponents 110 by photolithography, the initial substrate 100 is held on a substrate support device 120. The substrate support device 120 comprises a support platen 120a with which the initial substrate 100 lies flush, for example, by means of an electrostatic or suction system associated with the support platen 120a.

The face of the initial substrate 100 comprising the microcomponents 110 is then brought into contact with one face of a final wafer or substrate 200 (step S2) with a view to bonding by molecular bonding. A layer of oxide, for example, of $SiO_2$ may also be formed on the face of the initial substrate 100 comprising the microcomponents 110 and/or on the face of the final substrate 200 intended to be brought into intimate contact.

Figure 3B:
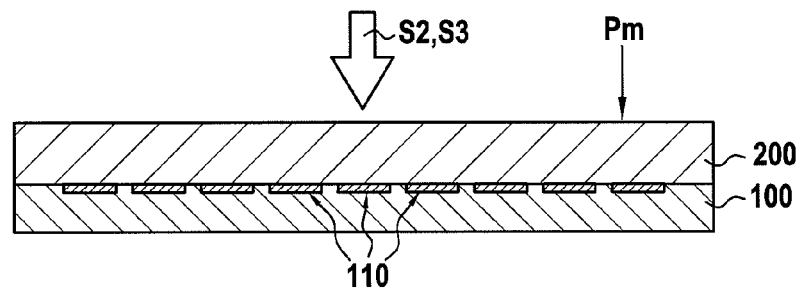

In accordance with the invention, the point of contact is initiated between the two substrates 100, 200 by applying a mechanical pressure Pm on the substrate 200, preferably close to the edge thereof (step S3, FIG. 3B). As indicated above, the mechanical pressure Pm is in the range from 0.1 MPa to 33.3 MPa and is applied to a bearing surface of 1 mm$^2$ or less.

Initiation of the point of contact involves propagating a bonding wave on the interface between the initial substrate 100 and the final substrate 200. The two substrates 100, 200 are then bonded together by molecular bonding over the whole of their contact surface (bonding interface), without or almost without deformation in the initial substrate 100 comprising the microcomponents 110. This thereby produces a buried layer of microcomponents 110 at the bonding interface between the substrates 100 and 200.

Figure 3C:
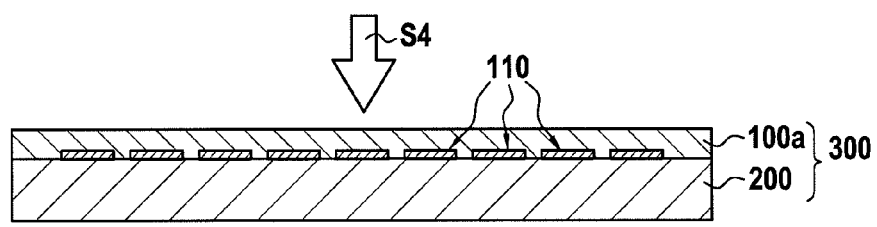

After bonding, and as can be seen in FIG. 3C, the initial substrate 100 is thinned-down in order to remove a portion of the material present above the layer of microcomponents 110 (step S4). When the substrate 100 is an SOI-type substrate, it is advantageously possible to use a buried insulating layer to define the thickness of the remaining layer 100a. Thus, a composite structure 300 is produced, formed from the final substrate 200 and a layer 100a corresponding to the remaining portion of the initial substrate 100. The initial substrate 100 may in particular be thinned-down by chemical-mechanical polishing (CMP), chemical etching, or by splitting or fracture along a plane of weakness that has been formed in the initial substrate 100 by atomic implantation.

Figure 3D:
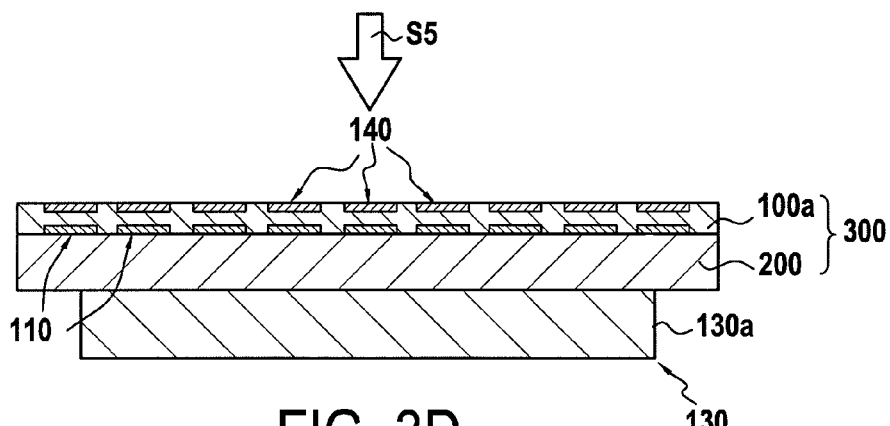
Figure 4:
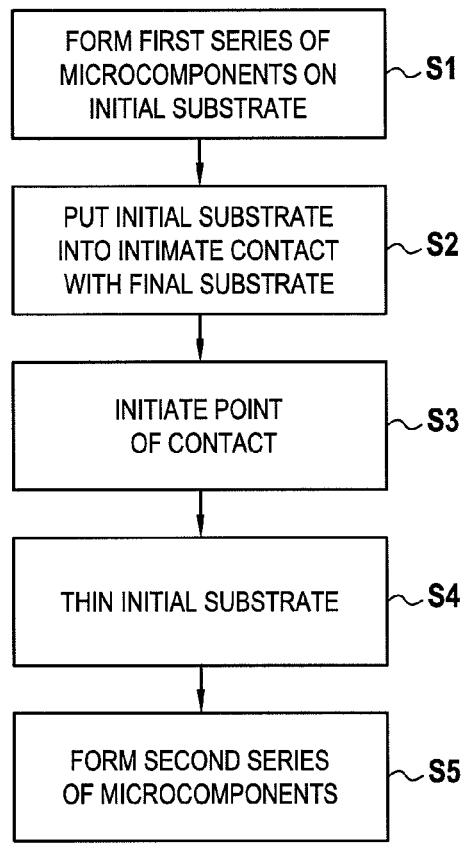
FIG. 4 is an organigram of the steps carried out during production of the three-dimensional structure shown in FIGS. 3A to 3D.

As can be seen in FIG. 3D, the next step in producing the three-dimensional structure consists of forming a second layer of microcomponents 140 at the exposed surface of the thinned-down initial substrate 100 (FIG. 3D, step S5). The microcomponents 140 may correspond to complementary portions of the microcomponents 110 to form a finished component and/or to distinct components intended to function with the microcomponents 140. In order to form the microcomponents 140 in alignment with the buried microcomponents 110, a photolithography mask is used that is similar to that employed to form the microcomponents 110. As during formation of the microcomponents 110, the composite structure 300 formed by the final substrate 200 and the layer 100a is held on a support platen 130a of a substrate carrier device 130 that is identical to the substrate support device 120. The photolithography mask is then applied to the free surface of the layer 100a.

In a variation, the three-dimensional structure is formed by a stack of layers, each layer having been transferred by the assembly method of the present invention, and each layer being in alignment with the directly adjacent layers.

By using the molecular bonding initiation method of the invention, the initial substrate 100 can be bonded onto the final substrate 200 without deformation or at least with a reduction in the deformations in such a manner that significant offsets of the microcomponents 110 before and after transfer of the initial substrate 100 onto the final substrate 200 are no longer observed. Thus, these residual offsets can be limited to values of less than 200 nm, or even 100 nm in a homogeneous manner over the whole surface of a wafer. The microcomponents 140, even those with very small sizes (for example, <1 μm), may thus be formed easily in alignment with the microcomponents 110, even after transfer of the initial substrate 100. This, for example, means that the microcomponents present in two layers or those on two distinct faces of a single layer can be interconnected via metal connections, minimizing the risks of poor interconnection.

As a result, the assembly method of the present invention can eliminate the phenomenon of overlay during transfer of one circuit layer onto another layer or onto a support substrate and produce very high quality multilayer semiconductor wafers.

The invention claimed is:

1. A method of initiating molecular bonding, comprising:
   bringing a surface of a first wafer to face a surface of a second wafer; and
   initiating a point of contact between the surface of the first wafer and the surface of the second wafer, wherein the initiating the point of contact comprises applying mechanical pressure in a range extending from 0.1 MPa to 33.3 MPa to one of the two wafers over a contact surface area of 1 mm$^2$ or less.

2. A method according to claim 1, wherein the mechanical pressure is in a range from 0.1 MPa to 10 MPa.

3. A method according to claim 2, wherein the mechanical pressure is in a range extending from 2 MPa to 5 MPa.

4. A method according to claim 1, wherein the contact surface area is in a range extending from 0.3 mm$^2$ to 1 mm$^2$ and is between a tool and one of the first or second wafers, and exerting a bearing force in a range extending from 0.1 N to 10 N on the one of the first or second wafers by the tool.

5. A method according to claim 4, further comprising providing a polymer material on an end of the tool intended to bear on the one of the first or second wafers.

6. A method of producing a composite three-dimensional structure, comprising:
   producing a first layer of microcomponents on one face of a first substrate; and
   establishing molecular bonds between the face of the first substrate and a face of a second substrate, wherein the establishing the molecular bonds comprises applying mechanical pressure in a range extending from 0.1 MPa to 33.3 MPa over a contact surface area of 1 mm$^2$ or less to one of the two substrates at a location aligned with a point of contact between the face of the first substrate and the face of the second substrate.

7. A method according to claim 6, further comprising thinning the first substrate after establishing the molecular bonds between the face of the first substrate and the face of the second substrate.

8. A method according to claim 7, further comprising producing a second layer of microcomponents on a second face of the first substrate that is opposite to the face of the first substrate comprising the first layer of microcomponents.

9. A method according to claim 6, further comprising forming a layer of oxide on the face of the first substrate comprising the first layer of microcomponents before establishing the molecular bonds between the face of the first substrate and the face of the second substrate.

10. A method according to claim 6, wherein the first substrate comprises an SOI structure.

11. A method according to claim 6, wherein microcomponents of the first layer of microcomponents comprise image sensors.

12. A method according to claim 6, wherein a deformation of the first substrate comprising the first layer of microcomponents is in a range extending from −40 μm to +40 μm.

13. A method according to claim 12, wherein a deformation of the second substrate is in a range extending from −10 μm to +10 μm.

14. A method according to claim 6, further comprising:
   measuring a deformation of at least one of the first substrate and the second substrate; and
   selecting a location of the point of contact as a function of the measured deformation.

15. A method according to claim 14, further comprising locating the point of contact at a center of at least one of the first substrate and the second substrate.

16. A method according to claim 14, further comprising:
   supporting the second substrate on a substrate support device; and
   wherein the point of contact is at a position where the substrate support device and the second substrate are at a shortest distance from one another.

17. A method according to claim 14, further comprising imposing a predetermined deformation on at least one of the first substrate and the second substrate while establishing the molecular bonds between the face of the first substrate and the face of the second substrate.

18. A method of fabricating a semiconductor structure, comprising:
   directly contacting a surface of a first semiconductor substrate with a surface of a second semiconductor substrate;
   contacting one of the first semiconductor substrate and the second semiconductor substrate with a tool at a point of contact;
   providing a contact area of about 1 mm$^2$ or less between the tool and the one of the first semiconductor substrate and the second semiconductor substrate at the point of contact; and
   applying mechanical pressure in a range extending from 0.1 MPa to 33.3 MPa between the first semiconductor substrate and the second semiconductor substrate at the point of contact and establishing direct molecular bonds between the surface of the first semiconductor substrate and the surface of the second semiconductor substrate.

19. A method according to claim 18, further comprising applying a force in a range extending from 0.1 N to 10 N on the one of the first semiconductor substrate and the second semiconductor substrate using the tool.

20. A method according to claim 19, further comprising selecting the tool to comprise a polymer material, and wherein contacting the one of the first semiconductor substrate and the second semiconductor substrate with the tool comprises contacting the one of the first semiconductor substrate and the second semiconductor substrate with the polymer material of the tool.

* * * * *